United States Patent
Park et al.

(10) Patent No.: US 8,910,011 B2
(45) Date of Patent: Dec. 9, 2014

(54) METHOD AND APPARATUS FOR DECODING LOW DENSITY PARITY CHECK CODE

(75) Inventors: Sung Ik Park, Daejeon (KR); Heung Mook Kim, Daejeon (KR); Won Gi Seo, Daejeon (KR)

(73) Assignees: Electronics and Telecommunications Research Institute, Daejeon (KR); Nextwill, Daejeon (KR)

( * ) Notice: Subject to any disclaimer, the term of this patent is extended or adjusted under 35 U.S.C. 154(b) by 259 days.

(21) Appl. No.: 13/425,840

(22) Filed: Mar. 21, 2012

(65) Prior Publication Data

US 2012/0290891 A1   Nov. 15, 2012

(30) Foreign Application Priority Data

May 12, 2011   (KR) .................. 10-2011-0044560

(51) Int. Cl.
  *H03M 13/00*   (2006.01)
  *H03M 13/11*   (2006.01)
(52) U.S. Cl.
  CPC ........ *H03M 13/112* (2013.01); *H03M 13/1162* (2013.01); *H03M 13/1151* (2013.01); *H03M 13/658* (2013.01); *H03M 13/6583* (2013.01)
  USPC ........... 714/752; 714/758; 714/780; 714/786; 714/794; 714/799
(58) Field of Classification Search
  CPC ............... H03M 13/1117; H03M 13/3927; H03M 13/1151; H03M 13/1162; H03M 13/255; H03M 13/1102; H04L 25/067
  USPC .................. 714/752, 758, 780, 786, 794, 799
  See application file for complete search history.

(56) References Cited

U.S. PATENT DOCUMENTS

| | | | | |
|---|---|---|---|---|
| 6,359,878 | B1* | 3/2002 | Lakkis et al. ................. | 370/350 |
| 6,778,615 | B1* | 8/2004 | Sweldens ..................... | 375/341 |
| 7,032,156 | B2* | 4/2006 | Yu et al. ....................... | 714/755 |
| 7,055,089 | B2* | 5/2006 | Miyauchi et al. ............. | 714/794 |
| 7,634,703 | B2* | 12/2009 | Kutz et al. ..................... | 714/755 |
| 8,578,238 | B2* | 11/2013 | Priewasser et al. ........... | 714/758 |
| 2002/0072828 | A1* | 6/2002 | Turner et al. .................. | 700/269 |
| 2004/0123230 | A1* | 6/2004 | Lee et al. ...................... | 714/800 |
| 2009/0254792 | A1* | 10/2009 | Wang ............................ | 714/758 |

FOREIGN PATENT DOCUMENTS

KR   10-0511552   8/2005

* cited by examiner

*Primary Examiner* — John P Trimmings
(74) *Attorney, Agent, or Firm* — Nelson Mullins Riley & Scarborough LLP; Anthony A. Laurentano, Esq.; Dipti Ramnarain, Esq.

(57) ABSTRACT

A low-density parity check (LDPC) code decoding method may be provided. The LDPC code decoding method may linearize or perform step-approximation on a natural logarithm hyperbolic cosine function included in a check node updating equation of a sum-product algorithm used for decoding an LDPC code, and may convert the linearized function to correspond to a check node updating equation of a min-sum algorithm.

20 Claims, 7 Drawing Sheets

METHOD AND APPARATUS FOR DECODING LOW DENSITY PARITY CHECK CODE

CROSS-REFERENCE TO RELATED APPLICATION

This application claims the benefit of Korean Patent Application No. 10-2011-0044560, filed on May 12, 2011, in the Korean Intellectual Property Office, the disclosure of which is incorporated herein by reference.

BACKGROUND

1. Field of the Invention

The present invention relates to a method and apparatus for improving a performance of decoding a low-density parity check (LDPC) code, which is one form of a forward error correction (FEC) coding scheme.

2. Description of the Related Art

In general, a sum-product algorithm, a minimum-sum (min-sum) algorithm, an offset min-sum algorithm, a normalized min-sum algorithm, and the like are utilized to decode a low-density parity check (LDPC) code.

The LDPC code may be expressed by a Tanner graph including a variable node and a check node, and may be decoded through iterative decoding, that is, iterative information transfer by the check node and variable node, in the Tanner graph.

The sum-product algorithm to be used for decoding the LDPC code may be expressed as described in the following.

In a variable node having two inputs, an information updating process may be expressed by $L(r) = L(u) + L(v)$.

In a check node having two inputs, an information updating process may be expressed by $$\tanh\left(\frac{L(r)}{2}\right) = \tanh\left[\frac{L(u)}{2}\right] \cdot \tanh\left[\frac{L(v)}{2}\right]$$

$$\Leftrightarrow L(r) = 2\tanh^{-1}\left\{\tanh\left[\frac{L(u)}{2}\right] \cdot \tanh\left[\frac{L(v)}{2}\right]\right\}$$

$$= \ln\cosh\left(\frac{L(u) + L(v)}{2}\right) - \ln\cosh\left(\frac{L(u) - L(v)}{2}\right).$$

In this example, $L(u)$ and $L(v)$ denote input information associated with each node, and $L(r)$ denotes output information of each node.

In a Binary Input-Additive White Gaussian Noise Channel (BI-AWGNC), $L(m)$ may be expressed by $$L(m) = \frac{2}{\sigma^2}m.$$

In this example, $\sigma^2$ denotes a variance of a channel noise.

As described in the foregoing, the sum-product algorithm may be expressed by a sum of input information in the variable node, and may be expressed by a product of hyperbolic tangent functions of input information, that is, a product of 'tan h( )' functions, in a check node.

To decode the LDPC code through use of the sum-product algorithm, estimation of $\sigma^2$, that is a variance of a channel noise, and calculation of a complex 'tan h( )' function or 'ln(cos h( ))' function may need to be performed.

To avoid the calculation of a complex function and the estimation of a variable of a channel noise, the min-sum algorithm has been proposed.

The min-sum algorithm for decoding the LDPC code may be expressed as described in the following.

In a variable node having two inputs, an information updating process may be expressed by $r = u + v$.

In a check node having two inputs, an information updating process may be expressed by $r = \text{sign}(u)\text{sign}(v)\min(|u|, |v|)$.

In this example, sign( ) denotes a sign of an input value.

The min-sum algorithm may be expressed by a sum of input information in the variable node, and may be expressed by a minimum value multiplied by signs of input information in the check node.

Although the sum-product algorithm may provide an excellent performance, the sum-product algorithm may have a significantly high complexity and may need to estimate a variance of a channel noise. Conversely, the min-sum algorithm may have a significantly low complexity and may not need to estimate a variance of a channel noise, but may provide a relatively low performance.

To improve deterioration of a performance caused while using the min-sum algorithm, either the normalized min-sum algorithm or the offset min-sum algorithm is generally utilized.

The normalized min-sum algorithm conventionally used for decoding the LDPC code may be expressed by $r = u + v$, $r = \alpha \cdot \text{sign}(u)\text{sign}(v)\min(|u|, |v|)$.

In this example, $\alpha(<1)$ denotes a constant for normalizing a check node, and may be appropriately selected based on a used LDPC code.

The offset min-sum algorithm conventionally used for decoding the LDPC code may be expressed by $r = u + v$, $r = \text{sign}(u)\text{sign}(v)\max(\min(|u|, |v|) - \beta, 0)$.

In this example, $\beta$ denotes an offset value of a check node, and may be appropriately selected based on an LDPC code to be used.

Although the normalized min-sum algorithm and the offset min-sum algorithm may provide a superior performance for a regular LDPC code, the performance may be deteriorated for an irregular LDPC code.

SUMMARY

According to an aspect of the present invention, there is provided a low-density parity check (LDPC) code decoding method, the method including linearizing a natural logarithm hyperbolic cosine function included in a check node updating equation of a sum-product algorithm used for decoding an LDPC code, and converting the linearized function to correspond to a check node updating equation of a minimum-sum (min-sum) algorithm.

According to another aspect of the present invention, there is provided an LDPC code decoding method, the method including performing step-approximation on a natural logarithm hyperbolic cosine function included in a check node updating equation of a sum-product algorithm used for decoding an LDPC code, and converting the step-approximated function to correspond to a check node updating equation of a min-sum algorithm.

According to still another aspect of the present invention, there is provided an LDPC code decoding apparatus, the apparatus including a first operation unit to linearize a natural logarithm hyperbolic cosine function included in a check node updating equation of a sum-product algorithm used for decoding an LDPC code, and a second operation unit to convert the linearized function to correspond to a check node updating equation of a min-sum algorithm.

According to yet another aspect of the present invention, there is provided an LDPC code decoding apparatus, the apparatus including a first operation unit to perform step-approximation on a natural logarithm hyperbolic cosine function included in a check node updating equation of a sum-product algorithm used for decoding an LDPC code, and a second operation unit to convert the step-approximated function to correspond to a check node updating equation of a min-sum algorithm.

Additional aspects, features, and/or advantages of the invention will be set forth in part in the description which follows and, in part, will be apparent from the description, or may be learned by practice of the invention.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
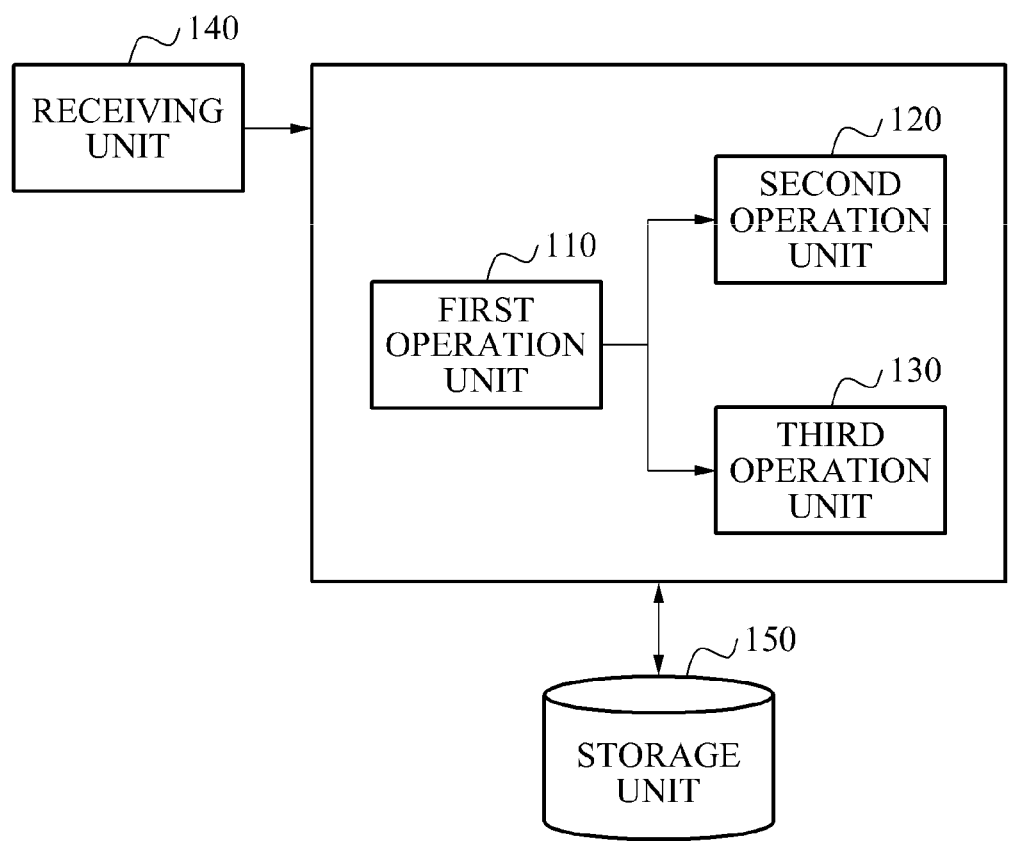
FIG. 1 is a block diagram illustrating a configuration of a decoding apparatus of a low-density parity check (LDPC) code according to an embodiment of the present invention.

Reference will now be made in detail to embodiments of the present invention, examples of which are illustrated in the accompanying drawings, wherein like reference numerals refer to the like elements throughout. Embodiments are described below to explain the present invention by referring to the figures.

FIG. 1 illustrates a configuration of a low-density parity check (LDPC) code decoding apparatus 100 of according to an embodiment of the present invention.

Referring to FIG. 1, the LDPC code decoding apparatus 100 may include a first operation unit 110 to linearize or to perform step-approximation on a natural logarithm hyperbolic cosine function included in a check node updating equation of a sum-product algorithm used for decoding an LDPC code, and may include a second operation unit 120 to convert the linearized function to correspond to a check node updating equation of a min-sum algorithm.

Also, the LDPC code decoding apparatus 100 may additionally include a third operation unit 130 to calculate a variable node updating equation to be used for decoding the LDPC code, according to a predetermined operation expression.

The LDPC code decoding apparatus 100 may receive channel information and a signal including an LDPC code received from at least one channel through the receiving unit 140, and may apply an algorithm for decoding the LDPC code through operation units 110, 120, and 130.

The LDPC code decoding apparatus 100 may additionally include a storage unit 150 to store data, for example, channel information, a signal including an LDPC code, and the like received through the receiving unit 140, and may also store data calculated through the operation units 110, 120, and 130 in the storage unit 150 and may manage the stored data.

Figure 2:
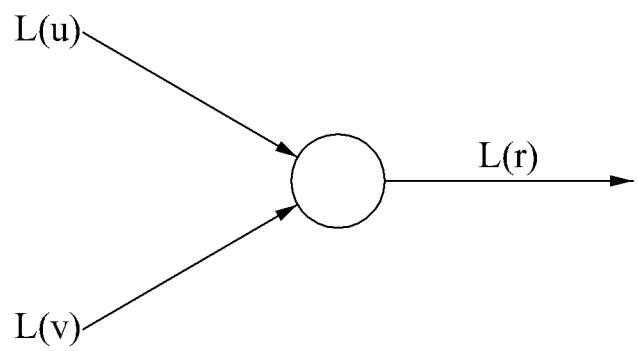
FIG. 2 is a diagram illustrating a variable node according to an embodiment of the present invention.
Figure 3:
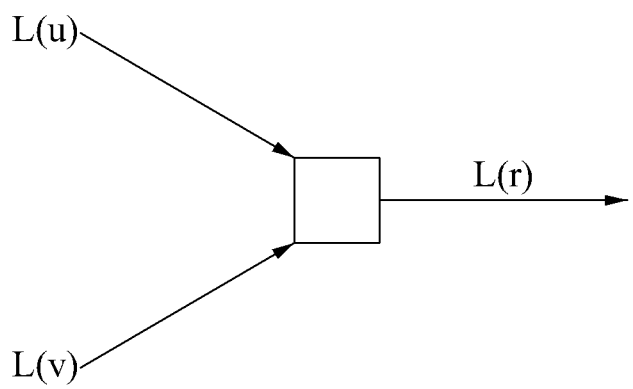
FIG. 3 is a diagram illustrating a check node according to an embodiment of the present invention.

FIG. 2 illustrates a variable node according to an embodiment of the present invention. FIG. 3 illustrates a check node according to an embodiment of the present invention.

Exemplary embodiments may describe that an LDPC code is decoded through iterative information transfer by a check node and a variable node, as illustrated in FIGS. 2 and 3.

An LDPC code decoding method performed through use of the LDPC code decoding apparatus 100 will be described.

Among LDPC code decoding methods that convert a sum-product algorithm into a min-sum algorithm so as to decode an LDPC code received through the receiving unit 140, a linearization updating method will be described.

Figure 4:
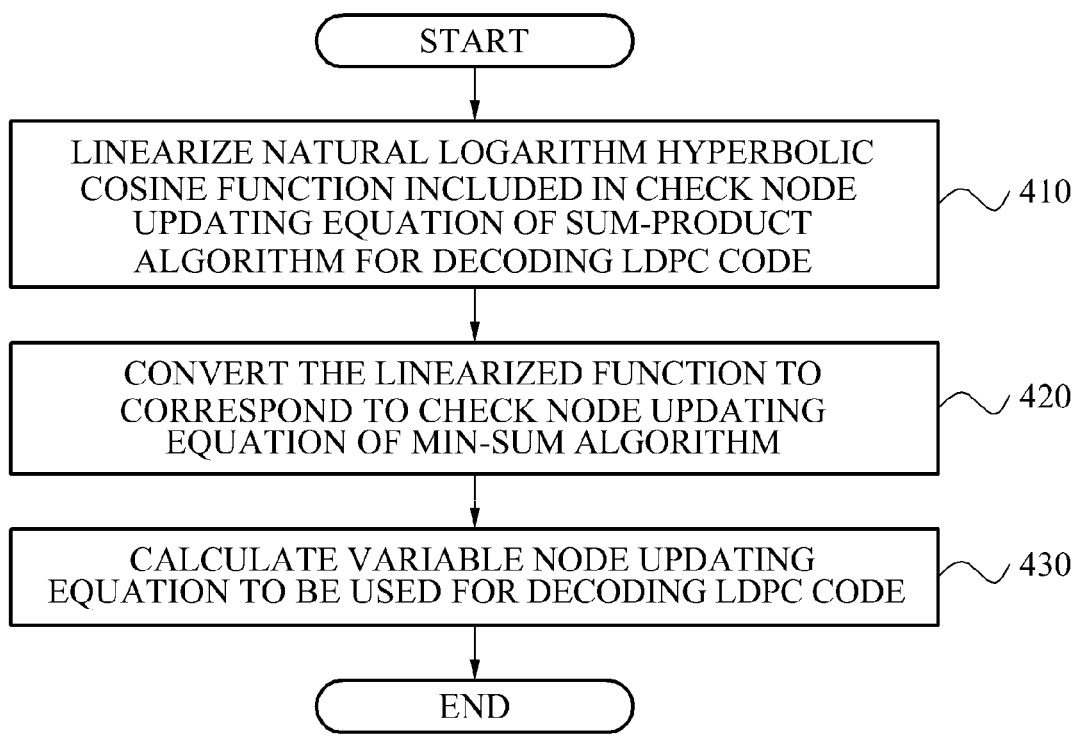
FIG. 4 is a flowchart illustrating an LDPC code decoding method according to an embodiment of the present invention.

FIG. 4 illustrates an LDPC code decoding method according to an embodiment of the present invention.

The first operation unit 110 may linearize a natural logarithm hyperbolic cosine function included in a check node updating equation of a sum-product algorithm used for decoding an LDPC code in operation 410.

The natural logarithm hyperbolic cosine function may be expressed by Equation 1.

$$\ln \cosh(x) = \begin{cases} a \cdot |x|, & |x| \leq A \\ |x| - \log 2, & |x| > A \end{cases} \quad \text{[Equation 1]}$$

In Equation 1, a denotes a slope of the check node updating equation, and A is $$\frac{\log 2}{1-a}.$$

The first operation unit 110 may apply the check node updating equation to which the linearized function is applied, according to Equation 2.

$$L(r) = \ln \cosh\left(\frac{L(u)+L(v)}{2}\right) - \ln \cosh\left(\frac{L(u)-L(v)}{2}\right) \approx$$

$$\begin{cases} a\left|\frac{L(u)+L(v)}{2}\right| - a\left|\frac{L(u)-L(v)}{2}\right|, & |L(u)+L(v)| \leq 2A, \\ & |L(u)-L(v)| \leq 2A \\ \left|\frac{L(u)+L(v)}{2}\right| - \log 2 - a\left|\frac{L(u)-L(v)}{2}\right|, & |L(u)+L(v)| > 2A, \\ & |L(u)-L(v)| \leq 2A \\ a\left|\frac{L(u)+L(v)}{2}\right| - \left|\frac{L(u)-L(v)}{2}\right| + \log 2, & |L(u)+L(v)| \leq 2A, \\ & |L(u)-L(v)| > 2A \\ \text{sign}(L(u))\text{sign}(L(v))\min(|L(u)|, |L(v)|), & |L(u)+L(v)| > 2A, \\ & |L(u)-L(v)| > 2A \end{cases}$$

[Equation 2]

In this example, L(u) and L(v) denote input information of a check node, and L(r) denotes output information of the check node.

Figure 5:
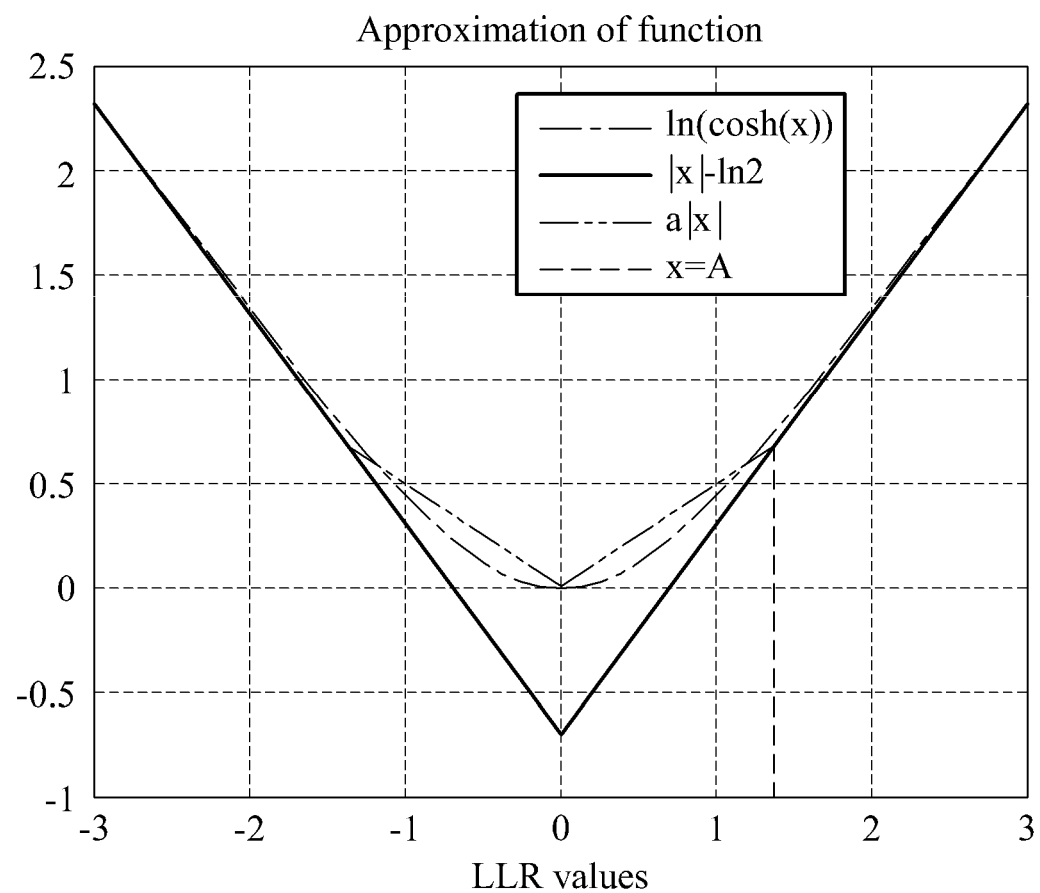
FIG. 5 is a diagram illustrating a linearization graph according to an embodiment of the present invention.

FIG. 5 illustrates a linearization graph according to an embodiment of the present invention.

When a natural logarithm hyperbolic cosine function included in a check node updating equation of a sum-product algorithm is linearized by the first operation unit 110, Equation 5 may be obtained.

The check node updating performed through linearization of the converted function may use L(m) including noise information of a channel and thus, an approximated check node may be modified so as to remove a process of estimating a variance of a channel noise.

That is, the second operation unit 120 may convert the linearized function to correspond to a check node updating equation of a min-sum algorithm in operation 420.

The second operation unit 120 may apply the check node updating equation to which the function converted to correspond to the check node updating equation of the min-sum algorithm is applied, according to Equation 3.

$$L(r) = \begin{cases} a \cdot \text{sign}(u)\text{sign}(v)\min(|u|,|v|), & |u+v| \leq \sigma_{op}^2 \cdot A, |u-v| \leq \sigma_{op}^2 \cdot A \\ \text{sign}(u)\text{sign}(v)\min(|u|,|v|) - C_{offset}, & |u+v| \leq \sigma_{op}^2 \cdot A, |u-v| \leq \sigma_{op}^2 \cdot A \\ \text{sign}(u)\text{sign}(v)\min(|u|,|v|) + C_{offset}, & |u+v| \leq \sigma_{op}^2 \cdot A, |u-v| \leq \sigma_{op}^2 \cdot A \\ \text{sign}(u)\text{sign}(v)\min(|u|,|v|), & |u+v| \leq \sigma_{op}^2 \cdot A, |u-v| \leq \sigma_{op}^2 \cdot A \end{cases}$$

[Equation 3]

In Equation 3, $C_{offset}$ denotes $$\sigma_{op}^2 \cdot \left(\frac{\log 2}{4}\right),$$

and $\sigma_{op}^2$ denotes a channel noise variance at an operating point of a check node.

$\sigma_{op}^2$ may be appropriately selected based on a used LDPC code, like a normalization constant of a normalized min-sum algorithm or an offset value of an offset min-sum algorithm.

$\sigma_{op}^2$ may be different based on a code, and may not be changed after an initial setting.

The third operation unit 130 may calculate a variable node updating equation to be used for decoding the LDPC code, as expressed by Equation 4 in operation 430.

$$r = u + v \quad \text{[Equation 4]}$$

In this example, u and v denotes input information of a variable node, and r denotes output information of the variable node.

Among LDPC code decoding methods that convert a sum-product algorithm into a min-sum algorithm to process decoding, a step-approximation updating method will be described.

Figure 6:
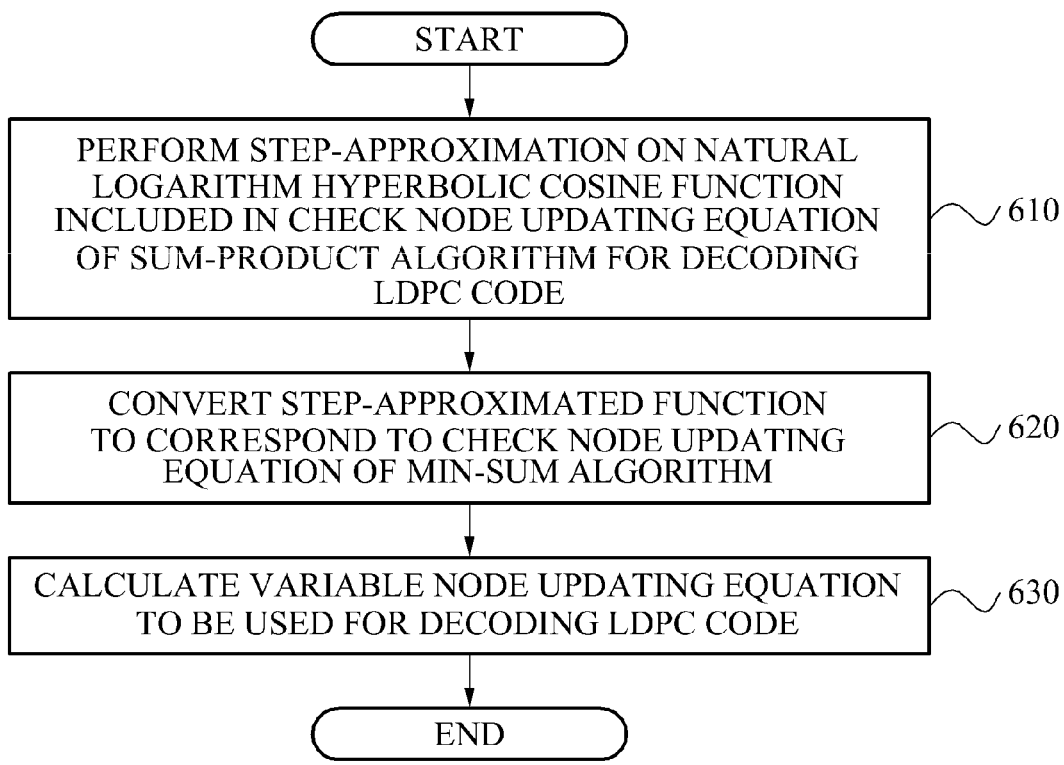
FIG. 6 is a flowchart illustrating an LDPC code decoding method according to another embodiment of the present invention.

FIG. 6 illustrates an LDPC code decoding method according to another embodiment of the present invention.

Referring to FIG. 6, the first operation unit 110 may perform step-approximation on a natural logarithm hyperbolic cosine function included in a check node updating equation of a sum-product algorithm used for decoding an LDPC code in operation 610.

The natural logarithm hyperbolic cosine function may be expressed by Equation 5.

$$\ln \cosh(x) = \begin{cases} b, & |x| \leq B \\ |x| - \log 2, & |x| > B \end{cases} \quad \text{[Equation 5]}$$

In Equation 5, b denotes a step value of the check node updating equation, and B is log 2+b.

The first operation unit 110 may apply the check node updating equation to which the step-approximated function is applied, according to Equation 6.

[Equation 6]

$$L(r) = \ln \cosh\left(\frac{L(u)+L(v)}{2}\right) - \ln \cosh\left(\frac{L(u)-L(v)}{2}\right) \approx$$

$$\begin{cases} 0, & |L(u)+L(v)| \leq 2B, |L(u)-L(v)| \leq 2B \\ \left|\frac{L(u)+L(v)}{2}\right| - \log 2 - b, & |L(u)+L(v)| > 2B, |L(u)-L(v)| \leq 2B \\ b - \left|\frac{L(u)-L(v)}{2}\right| + \log 2, & |L(u)+L(v)| \leq 2B, |L(u)-L(v)| > 2B \\ \text{sign}(L(u))\text{sign}(L(v))\min(|L(u)|,|L(v)|), & |L(u)+L(v)| > 2B, |L(u)-L(v)| > 2B \end{cases}$$

In Equation 6, L(u) and L(v) denotes input information of a check node, and L(r) denotes output information of the check node.

Figure 7:
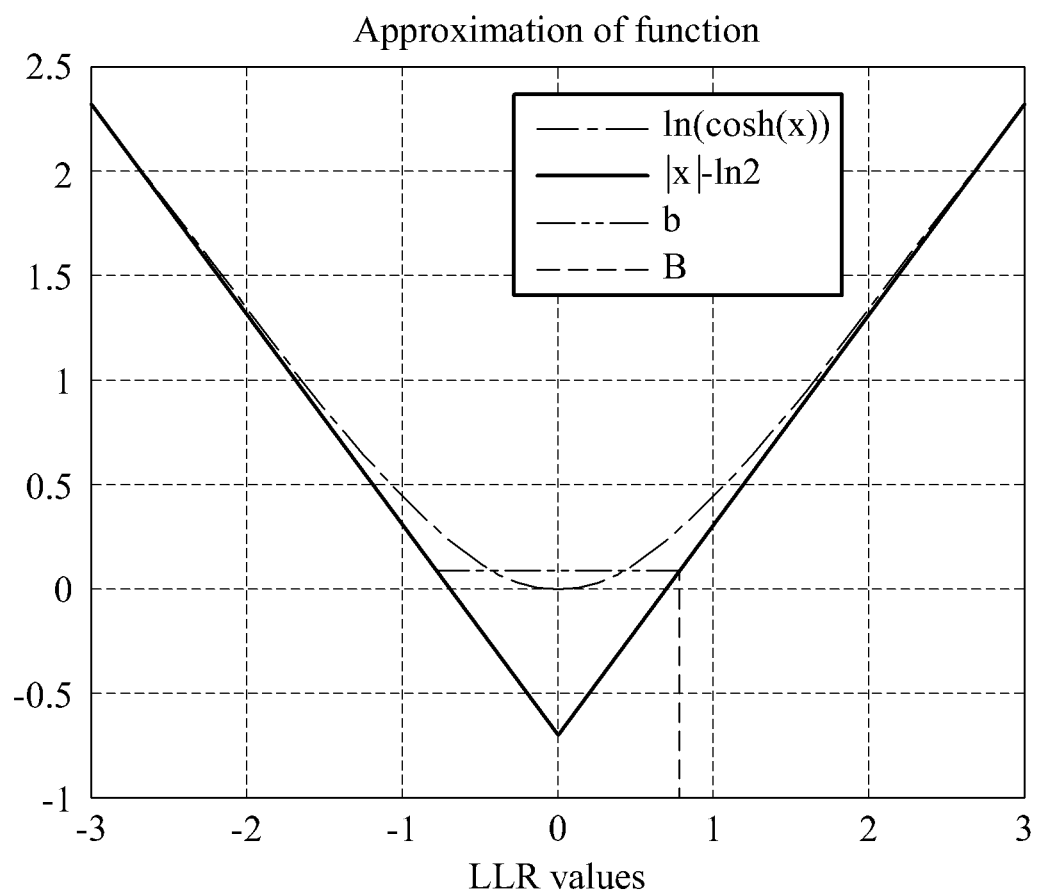
FIG. 7 is a diagram illustrating a step-approximation graph according to an embodiment of the present invention.

FIG. 7 illustrates a step-approximation graph according to an embodiment of the present invention.

When a natural logarithm hyperbolic cosine function included in a check node updating equation of a sum-product algorithm is linearized by the first operation unit 110, Equation 7 may be obtained.

The check node updating through step-approximation of the converted function may need to use L(m) including noise information of a channel and thus, an approximated check node may be modified to remove a process of estimating a variance of a channel noise.

The second operation unit 120 may convert the step-approximated function to correspond to a check node updating equation of a min-sum algorithm in operation 620.

The second operation unit 120 may apply the check node updating equation to which the function converted to correspond to the check node updating equation of the min-sum algorithm is applied, according to Equation 7.

[Equation 7]

$$L(r) = \begin{cases} 0, & |u+v| \leq \sigma_{op}^2 \cdot B, |u-v| \leq \sigma_{op}^2 \cdot B \\ \text{sign}(u)\text{sign}(v)\min(|u|,|v|) - C_{offset}, & |u+v| \leq \sigma_{op}^2 \cdot B, |u-v| \leq \sigma_{op}^2 \cdot B \\ \text{sign}(u)\text{sign}(v)\min(|u|,|v|) + C_{offset}, & |u+v| \leq \sigma_{op}^2 \cdot B, |u-v| \leq \sigma_{op}^2 \cdot B \\ \text{sign}(u)\text{sign}(v)\min(|u|,|v|), & |u+v| \leq \sigma_{op}^2 \cdot B, |u-v| \leq \sigma_{op}^2 \cdot B \end{cases}$$

In Equation 7, $C_{offset}$ denotes $$\sigma_{op}^2 \cdot \left(\frac{b + \log 2}{4}\right),$$

and $\sigma_{op}^2$ denotes a channel noise variance at an operating point of the check node.

$\sigma_{op}^2$ may be appropriately selected based on a used LDPC code, like a normalization constant of a normalized min-sum algorithm or an offset value of an offset min-sum algorithm. Also, $\sigma_{op}^2$ may be different based on a code, and may not be changed after an initial setting.

The third operation unit 130 may calculate a variable node updating equation to be used for decoding the LDPC code, as expressed by Equation 8, in operation 630.

$$r = u + v \quad \text{[Equation 8]}$$

In Equation 8, u and v denotes input information of a variable node, and r denotes output information of the variable node.

Figure 8:
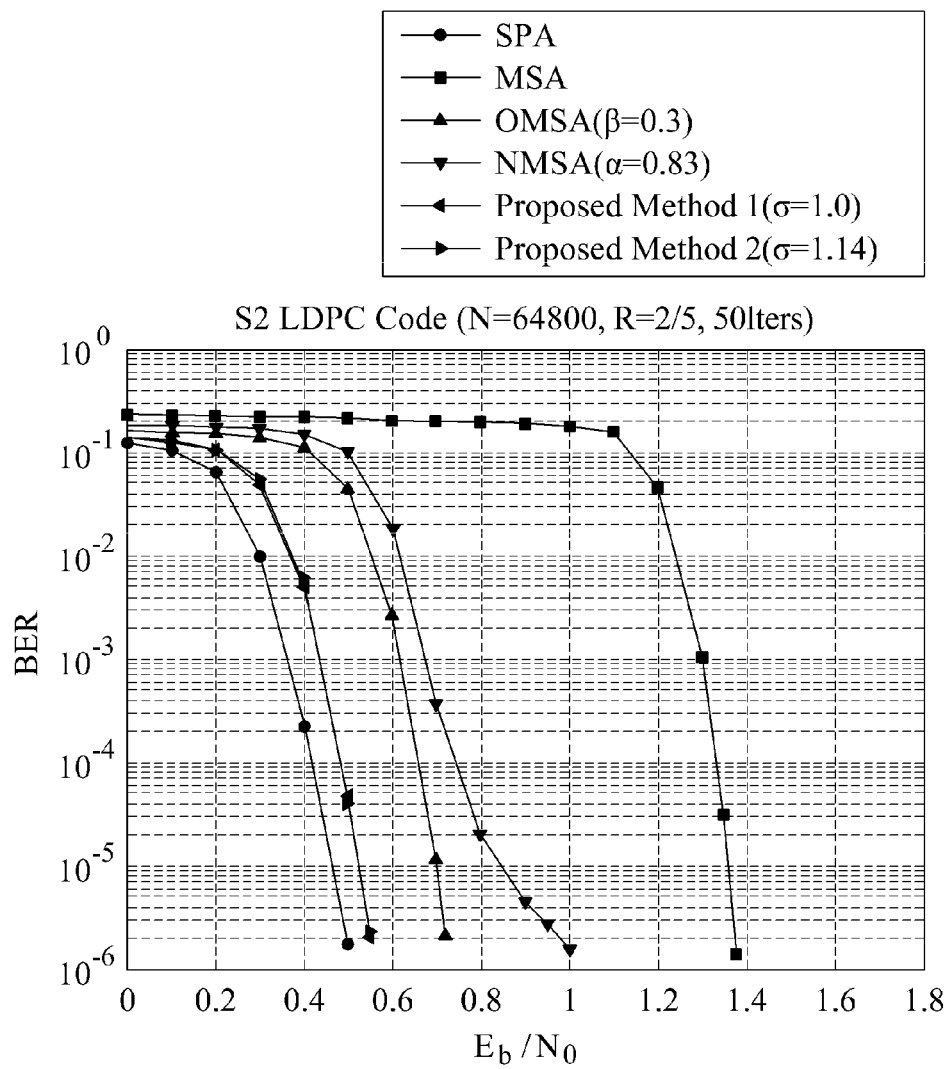
FIG. 8 is a diagram illustrating various examples of an LDPC code decoding algorithm and a bit error rate (BER) performance according to an embodiment of the present invention.

FIG. 8 illustrates various examples of an LDPC code decoding algorithm and a bit error rate (BER) performance according to an embodiment of the present invention.

Referring to FIG. 8, 'Proposed Method 1' corresponds to an LDPC code decoding through linearization and 'Proposed Method 2' corresponds to an LDPC code decoding through step-approximation.

For ease of description, a and b are assumed to be 0.5 and 0, respectively.

Also, it is assumed that σ(=1.0) at an operating point for 'Proposed Method 1' and σ(=1.14) at an operating point for 'Proposed Method 2' select a code rate of 0.4.

The LDPC code decoding apparatus 100 may provide an LDPC code decoding method through linearization or step approximation and thus, may provide a performance similar to a sum-product algorithm and superior than an offset min-sum algorithm.

The LDPC code decoding method may have a low complexity, and may provide a performance similar to a sum-product algorithm and thus, a reception performance of a communication and broadcasting system that uses an LDPC code may be improved.

The LDPC code decoding method may improve a performance of decoding an LDPC code, which is a form of an FEC coding scheme.

The LDPC code decoding method may improve a reception performance of a communication and broadcasting system that uses an LDPC code.

The LDPC code decoding method may have a low complexity and may provide a performance similar to a sum-product algorithm.

The method according to the above-described embodiments of the present invention may be recorded in non-transitory computer readable media including program instructions to implement various operations embodied by a computer. The media may also include, alone or in combination with the program instructions, data files, data structures, and the like. Examples of non-transitory computer readable media include magnetic media such as hard disks, floppy disks, and magnetic tape; optical media such as CD ROM discs and DVDs; magneto-optical media such as floptical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention, or vice versa.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A method of decoding a low-density parity check (LDPC) code, the method comprising:

linearizing a natural logarithm hyperbolic cosine function included in a check node updating equation of a sum-product algorithm used for decoding an LDPC code; and converting the linearized function to correspond to a check node updating equation of a minimum-sum (min-sum) algorithm.

2. The method of claim 1, wherein the natural logarithm hyperbolic cosine function is expressed by Equation 1:

$$\ln \cosh(x) = \begin{cases} a \cdot |x|, & |x| \leq A \\ |x| - \log 2, & |x| > A \end{cases}, \quad \text{[Equation 1]}$$

wherein a denotes a slope of the check node updating equation, and A is $$\frac{\log 2}{1-a}.$$

3. The method of claim 2, wherein the check node updating equation to which the linearized function is applied is expressed by Equation 2:

[Equation 2]

$$L(r) = \ln \cosh\left(\frac{L(u)+L(v)}{2}\right) - \ln \cosh\left(\frac{L(u)-L(v)}{2}\right) \approx$$

$$\begin{cases} a\left|\frac{L(u)+L(v)}{2}\right| - a\left|\frac{L(u)-L(v)}{2}\right|, & |L(u)+L(v)| \leq 2A, \\ & |L(u)-L(v)| \leq 2A \\ \left|\frac{L(u)+L(v)}{2}\right| - \log 2 - a\left|\frac{L(u)-L(v)}{2}\right|, & |L(u)+L(v)| > 2A, \\ & |L(u)-L(v)| \leq 2A \\ a\left|\frac{L(u)+L(v)}{2}\right| - \left|\frac{L(u)-L(v)}{2}\right| + \log 2, & |L(u)+L(v)| \leq 2A, \\ & |L(u)-L(v)| > 2A \\ \text{sign}(L(u))\text{sign}(L(v))\min(|L(u)|,|L(v)|), & |L(u)+L(v)| > 2A, \\ & |L(u)-L(v)| > 2A \end{cases}$$

wherein L(u) and L(v) denote input information of a check node, and L(r) denotes output information of the check node.

4. The method of claim 3, wherein the check node updating equation to which the function converted to correspond to the check node updating equation of the min-sum algorithm is applied is expressed by Equation 3:

$$L(r) = \begin{cases} a \cdot \text{sign}(u)\text{sign}(v)\min(|u|,|v|), & |u+v| \leq \sigma_{op}^2 \cdot A, \\ & |u-v| \leq \sigma_{op}^2 \cdot A \\ \text{sign}(u)\text{sign}(v)\min(|u|,|v|) - C_{offset}, & |u+v| \leq \sigma_{op}^2 \cdot A, \\ & |u-v| \leq \sigma_{op}^2 \cdot A \\ \text{sign}(u)\text{sign}(v)\min(|u|,|v|) + C_{offset}, & |u+v| \leq \sigma_{op}^2 \cdot A, \\ & |u-v| \leq \sigma_{op}^2 \cdot A \\ \text{sign}(u)\text{sign}(v)\min(|u|,|v|), & |u+v| \leq \sigma_{op}^2 \cdot A, \\ & |u-v| \leq \sigma_{op}^2 \cdot A \end{cases}$$ [Equation 3]

wherein $C_{offset}$ is $$\sigma_{op}^2 \cdot \left(\frac{\log 2}{4}\right),$$

and $\sigma_{op}^2$ denotes a channel noise variance at an operating point of the check node.

5. The method of claim 1, further comprising:
calculating a variable node updating equation to be used for decoding the LDPC code according to Equation 4:

$$r = u + v,$$ [Equation 4]

wherein u and v denote input information of a variable node, and r denotes output information of the variable node.

6. A method of decoding a low-density parity check (LDPC) code, the method comprising:
performing step-approximation on a natural logarithm hyperbolic cosine function included in a check node updating equation of a sum-product algorithm used for decoding an LDPC code; and
converting the step-approximated function to correspond to a check node updating equation of a minimum sum (min-sum) algorithm.

7. The method of claim 6, wherein the natural logarithm hyperbolic cosine function is expressed by Equation 5:

$$\text{lncosh}(x) = \begin{cases} b, & |x| \leq B \\ |x| - \log 2, & |x| > B \end{cases},$$ [Equation 5]

wherein b denotes a step value of the check node updating equation, and B is log 2+b.

8. The method of claim 7, wherein the check node updating equation to which the step-approximated function is applied is expressed by Equation 6:

$$L(r) = \text{lncosh}\left(\frac{L(u)+L(v)}{2}\right) - \text{lncosh}\left(\frac{L(u)-L(v)}{2}\right) \approx$$ [Equation 6]

-continued $$\begin{cases} 0, & |L(u)+L(v)| \leq 2B, \\ & |L(u)-L(v)| \leq 2B \\ \left|\frac{L(u)+L(v)}{2}\right| - \log 2 - b, & |L(u)+L(v)| > 2B, \\ & |L(u)-L(v)| \leq 2B \\ b - \left|\frac{L(u)-L(v)}{2}\right| + \log 2, & |L(u)+L(v)| \leq 2B, \\ & |L(u)-L(v)| > 2B \\ \text{sign}(L(u))\text{sign}(L(v))\min(|L(u)|,|L(v)|), & |L(u)+L(v)| > 2B, \\ & |L(u)-L(v)| > 2B \end{cases}$$

wherein L(u) and L(v) denote input information of a check node, and L(r) denotes output information of the check node.

9. The method of claim 8, wherein the check node updating equation to which the function converted to correspond to the check node updating equation of the min-sum algorithm is applied is expressed by Equation 7:

$$L(r) = \begin{cases} 0, & |u+v| \leq \sigma_{op}^2 \cdot B, \\ & |u-v| \leq \sigma_{op}^2 \cdot B \\ \text{sign}(u)\text{sign}(v)\min(|u|,|v|) - C_{offset}, & |u+v| \leq \sigma_{op}^2 \cdot B, \\ & |u-v| \leq \sigma_{op}^2 \cdot B \\ \text{sign}(u)\text{sign}(v)\min(|u|,|v|) + C_{offset}, & |u+v| \leq \sigma_{op}^2 \cdot B, \\ & |u-v| \leq \sigma_{op}^2 \cdot B \\ \text{sign}(u)\text{sign}(v)\min(|u|,|v|), & |u+v| \leq \sigma_{op}^2 \cdot B, \\ & |u-v| \leq \sigma_{op}^2 \cdot B \end{cases}$$ [Equation 7]

wherein $C_{offset}$ is $$\sigma_{op}^2 \cdot \left(\frac{b + \log 2}{4}\right),$$

and $\sigma_{op}^2$ denotes a channel noise variance at an operating point of the check node.

10. The method of claim 6, further comprising:
calculating a variable node updating equation to be used for decoding the LDPC code according to Equation 8:

$$r = u + v,$$ [Equation 8]

wherein u and v denote input information of a variable node, and r denotes output information of the variable node.

11. An apparatus for decoding a low-density parity check (LDPC) code, the apparatus comprising:
a first operation unit to linearize a natural logarithm hyperbolic cosine function included in a check node updating equation of a sum-product algorithm used for decoding an LDPC code; and
a second operation unit to convert the linearized function to correspond to a check node updating equation of a minimum-sum (min-sum) algorithm.

12. The apparatus of claim 11, wherein the natural logarithm hyperbolic cosine function is expressed by Equation 1:

$$\text{lncosh}(x) = \begin{cases} a \cdot |x|, & |x| \le A \\ |x| - \log 2, & |x| > A \end{cases}, \quad \text{[Equation 1]}$$

wherein a denotes a slope of the check node updating equation, and A is $$\frac{\log 2}{1-a}.$$

13. The apparatus of claim 12, wherein the check node updating equation to which the linearized function is applied is expressed by Equation 2:

$$L(r) = \text{lncosh}\left(\frac{L(u)+L(v)}{2}\right) - \text{lncosh}\left(\frac{L(u)-L(v)}{2}\right) \approx$$

[Equation 2]

$$\begin{cases} a\left|\frac{L(u)+L(v)}{2}\right| - a\left|\frac{L(u)-L(v)}{2}\right|, & |L(u)+L(v)| \le 2A, \\ & |L(u)-L(v)| \le 2A \\ \left|\frac{L(u)+L(v)}{2}\right| - \log 2 - a\left|\frac{L(u)-L(v)}{2}\right|, & |L(u)+L(v)| > 2A, \\ & |L(u)-L(v)| \le 2A \\ a\left|\frac{L(u)+L(v)}{2}\right| - \left|\frac{L(u)-L(v)}{2}\right| + \log 2, & |L(u)+L(v)| \le 2A, \\ & |L(u)-L(v)| > 2A \\ \text{sign}(L(u))\text{sign}(L(v))\min(|L(u)|, |L(v)|), & |L(u)+L(v)| > 2A, \\ & |L(u)-L(v)| > 2A \end{cases}$$

wherein L(u) and L(v) denote input information of a check node, and L(r) denotes output information of the check node.

14. The apparatus of claim 13, wherein the check node updating equation to which the function converted to correspond to the check node updating equation of the min-sum algorithm is applied is expressed by Equation 3:

[Equation 3]

$$L(r) = \begin{cases} a \cdot \text{sign}(u)\text{sign}(v)\min(|u|, |v|), & |u+v| \le \sigma_{op}^2 \cdot A, \\ & |u-v| \le \sigma_{op}^2 \cdot A \\ \text{sign}(u)\text{sign}(v)\min(|u|, |v|) - C_{\textit{offset}}, & |u+v| \le \sigma_{op}^2 \cdot A, \\ & |u-v| \le \sigma_{op}^2 \cdot A \\ \text{sign}(u)\text{sign}(v)\min(|u|, |v|) + C_{\textit{offset}}, & |u+v| \le \sigma_{op}^2 \cdot A, \\ & |u-v| \le \sigma_{op}^2 \cdot A \\ \text{sign}(u)\text{sign}(v)\min(|u|, |v|), & |u+v| \le \sigma_{op}^2 \cdot A, \\ & |u-v| \le \sigma_{op}^2 \cdot A \end{cases}$$

wherein $C_{\textit{offset}}$ is $$\sigma_{op}^2 \cdot \left(\frac{\log 2}{4}\right),$$

and $\sigma_{op}^2$ denotes a channel noise variance at an operating point of the check node.

15. The apparatus of claim 11, further comprising:

a third operation unit to calculate a variable node updating equation to be used for decoding the LDPC code according to Equation 4:

$$r = u + v, \quad \text{[Equation 4]}$$

wherein u and v denote input information of a variable node, and r denotes output information of the variable node.

16. An apparatus for decoding a low-density parity check (LDPC) code, the apparatus comprising:

a first operation unit to perform step-approximation on a natural logarithm hyperbolic cosine function included in a check node updating equation of a sum-product algorithm used for decoding an LDPC code; and a second operation unit to convert the step-approximated function to correspond to a check node updating equation of a minimum-sum (min-sum) algorithm.

17. The apparatus of claim 16, wherein the natural logarithm hyperbolic tangent function is expressed by Equation 5:

$$\text{lncosh}(x) = \begin{cases} b, & |x| \le B \\ |x| - \log 2, & |x| > B \end{cases}, \quad \text{[Equation 5]}$$

wherein b denotes a step value of the check node updating equation, and B is log 2+b.

18. The apparatus of claim 17, wherein the check node updating equation to which the step-approximated function is applied is expressed by Equation 6:

[Equation 6]

$$L(r) = \text{lncosh}\left(\frac{L(u)+L(v)}{2}\right) - \text{lncosh}\left(\frac{L(u)-L(v)}{2}\right) \approx$$

$$\begin{cases} 0, & |L(u)+L(v)| \le 2B, \\ & |L(u)-L(v)| \le 2B \\ \left|\frac{L(u)+L(v)}{2}\right| - \log 2 - b, & |L(u)+L(v)| > 2B, \\ & |L(u)-L(v)| \le 2B \\ b - \left|\frac{L(u)-L(v)}{2}\right| + \log 2, & |L(u)+L(v)| \le 2B, \\ & |L(u)-L(v)| > 2B \\ \text{sign}(L(u))\text{sign}(L(v))\min(|L(u)|, |L(v)|), & |L(u)+L(v)| > 2B, \\ & |L(u)-L(v)| > 2B \end{cases}$$

wherein L(u) and L(v) denote input information of a check node, and L(r) denotes output information of the check node.

19. The apparatus of claim 18, wherein the check node updating equation to which the function converted to correspond to the check node updating equation of the min-sum algorithm is applied is expressed by Equation 7:

[Equation 7]

$$L(r) = \begin{cases} 0, & |u+v| \leq \sigma_{op}^2 \cdot B, \\ & |u-v| \leq \sigma_{op}^2 \cdot B \\ \text{sign}(u)\text{sign}(v)\min(|u|,|v|) - C_{offset}, & |u+v| \leq \sigma_{op}^2 \cdot B, \\ & |u-v| \leq \sigma_{op}^2 \cdot B \\ \text{sign}(u)\text{sign}(v)\min(|u|,|v|) + C_{offset}, & |u+v| \leq \sigma_{op}^2 \cdot B, \\ & |u-v| \leq \sigma_{op}^2 \cdot B \\ \text{sign}(u)\text{sign}(v)\min(|u|,|v|), & |u+v| \leq \sigma_{op}^2 \cdot B, \\ & |u-v| \leq \sigma_{op}^2 \cdot B \end{cases}$$

wherein $C_{offset}$ is $$\sigma_{op}^2 \cdot \left(\frac{b + \log 2}{4}\right),$$

and $\sigma_{op}^2$ denotes a channel noise variance at an operating point of the check node.

20. The apparatus of claim 16, further comprising:
a third operation unit to calculate a variable node updating equation to be used for decoding the LDPC code according to Equation 8:

$$r = u + v, \quad \text{[Equation 8]}$$

wherein u and v denote input information of a variable node, and r denotes output information of the variable node.

* * * * *